United States Patent [19]
Tanigawa

[11] Patent Number: 5,775,940
[45] Date of Patent: Jul. 7, 1998

[54] CARD-TYPE CONNECTOR WITH FUSIBLE ELEMENTS

[75] Inventor: Hidemi Tanigawa, Yokkaichi, Japan

[73] Assignee: Sumitomo Wiring Systems, Ltd., Japan

[21] Appl. No.: 690,772

[22] Filed: Aug. 1, 1996

[30] Foreign Application Priority Data

Aug. 1, 1995 [JP] Japan ................................. 7-216619

[51] Int. Cl.$^6$ ........................................... H01R 31/08
[52] U.S. Cl. ........................................... 439/507; 337/293
[58] Field of Search ................................. 439/507, 509, 439/951; 337/293, 273, 160, 161, 227, 234, 255, 256; 29/876, 877

[56] References Cited

U.S. PATENT DOCUMENTS

| 2,934,627 | 4/1960 | Bristol et al. | 337/293 |
| 4,303,291 | 12/1981 | Dines | 439/495 |
| 5,044,980 | 9/1991 | Krumme et al. | 439/67 |

FOREIGN PATENT DOCUMENTS

| 52-86148 | 7/1977 | Japan . |
| 56-38959 | 4/1981 | Japan . |
| 61-14625 | 4/1986 | Japan . |

*Primary Examiner*—Neil Abrams
*Attorney, Agent, or Firm*—Jordan B. Bierman; Bierman, Muserlian and Lucas

[57] ABSTRACT

A card-type connector, for use in cooperation with a socket, comprising an insulation board provided with grooves on its first and second faces. Electrical conductors are in the grooves and extend onto the first and second faces, bending around a first end of the board. A cover protecting a second end of the board, spaced apart from the first, includes the ends of the electrical conductors on each of the faces. When the connector is inserted into the socket with its second end leading, the electrical terminals of the socket first ride on the cover, and then contact the electrical conductors, thereby avoiding the peeling off or movement of the conductors resulting from the insertion. The connector may include a second cover between the first and second ends of the board and a cap at the first end. Preferably, the electrical conductors are fusible cut-out elements.

19 Claims, 8 Drawing Sheets

CARD-TYPE CONNECTOR WITH FUSIBLE ELEMENTS

This Application claims the benefit of the priority of Japanese Application 7-216619, filed Aug. 1, 1995.

The present Invention relates to a card-type connector to be used in cooperation with a socket which includes complementary electrical terminals. The connector comprises at least one electrical conductor on the surface of a board and serves to configure various circuit systems by connecting or disconnecting parts thereof and by modifying the circuits to be used. If the conductor is a fusible element, then the connector can act as a fuse.

BACKGROUND OF THE INVENTION

FIGS. 1 and 2 show a board containing a fusible element, commonly called a "plate-shaped fuse", disclosed in published Japanese utility model application Sho 56-38959. This fuse constitutes one kind of card-type connector.

Fuse 1 consists of thin and fusible cut-out elements 3 as electrical conductors on the surface of insulation substrate 2. Fuse 1 is folded widthways at its center to present a pair of parallel and outwardly facing contacts adjacent its terminal ends, as shown in FIG. 2, for insertion into a socket. The socket includes pairs of metallic terminals facing each other and defining a slit-shaped aperture adapted to receive the corresponding terminal end of fuse 1. When fuse 1 is inserted into the socket, it is interposed between the pairs of metallic terminal parts, thereby forming an electric circuit through the thin and fusible elements. When an electric current flows through such a circuit and exceeds a predetermined intensity, elements 3 are melted by the heat generated, thus breaking the circuit.

However, the above-mentioned plate-shaped fuse suffers from certain disadvantages. In use, the fuse is inserted between the confronting metallic terminals of the socket, and then retracted therefrom. For each such action, the ends of the metallic terminals must force the pairs of terminals apart, thereby abrading them. By repeating this operation, the ends gradually become susceptible to peeling off.

SUMMARY OF THE INVENTION

In view of the above consideration, it is the object of the present Invention to provide a connector of the foregoing type comprising at least one electrical conductor, the insertion end of which is so constructed as to reduce its susceptibility to peeling.

In accordance with the present Invention, there is provided a card-type connector which is to be used in cooperation with a complementary socket having electrically contacting pairs of terminals. The pairs are preferably biased toward each other so that good contact is provided when the connector is inserted therebetween.

The connector itself consists of an insulation board which is usually substantially rectangular in shape. It has two end edges spaced apart and parallel to each other, and two longitudinal edges, perpendicular to the end edges and spaced apart from each other. The board has a first face and a second face opposite thereto, both faces facing outwardly. A foot portion is the first part of the connector which is inserted into the socket and a head portion is remote therefrom. Preferably midway between the head and foot portions is the intermediate body section. Each of the first and second faces has at least one groove extending from the foot portion to the head portion; the groove on the first face is aligned with the corresponding groove on the second face.

An electrical conductor is located within the groove on both the first and second faces. It extends from the first face around the head portion onto the second face so that each of the ends thereof is located at the foot portion or in the intermediate body section of each face.

It is a feature of the present Invention that at least the ends of the electrical conductor are encased in some form of protective cover. This may be a channel member having a U-shaped cross section, a coating applied in liquid or semi-liquid form, etc. It has been found advantageous that the electrical conductor extends all the way to the foot portion of the connector. However, if the ends of the conductor are located in the intermediate body section, the protective cover also extends to that point so that the ends are covered thereby.

Alternatively, the cover is a pair of protective plates, each plate configured so as to overlie a substantial part of one of the two faces of the board, so that the ends of the electrical conductor are also covered. Each of the plates has an opening at the central area thereof, exposing the conductor and through which an electrical connection can be effected.

By suitable selection of the conductor, the connector can be utilized as a fuse. In this case, the conductor is of such cross section and material that, when an overload occurs in the circuit, the conductor melts and breaks the connection. In a particularly preferred form of the connector, there is a plurality of grooves, conductors, and terminals. Thus, many circuits can be connected and/or fused by the use of a single connector.

The connector is produced by starting with an insulation plate having longitudinal sides and lateral ends. An elongated opening is formed within the plate; the opening extends over a substantial portion of a central folding line which is between the longitudinal sides, and parallel to the lateral sides.

At least one groove is formed on the plate extending from one lateral end to the other lateral end and substantially parallel to the longitudinal sides, the groove intersecting the elongated opening. An electrical conductor having two ends and a central portion is located within the groove so that the ends of the electrical conductor are placed near the lateral ends of the plate and the central portion of the electrical conductor extends over the elongated opening.

The insulation plate, together with the electrical conductor, is folded along the central folding line so that each half of the plate has the conductor on the outer face thereof. This results in a board comprised of a foot portion, including the lateral ends of the plate, a head portion including the elongated opening, and an intermediate body section. The protective cover is then applied to the foot portion.

A comparatively small, protecting plate, which may be hinged to one longitudinal side, is provided on each side of the central line, and these plates are placed on the corresponding faces of the board and fixed thereto, thereby covering the ends of the conductor. Advantageously, the protective plates are integral with the insulation plate for ease of assembly. Also, a cap may be supplied on the head portion.

Thus, the ends of the electrical conductor are protected by the cover, so that the metallic terminals of the socket first ride up over the protective cover, at the foot portion, and then contact the electrical conductor. In this configuration, the metallic parts do not abrade the foot portion of the electrical conductor and damage thereto is minimized.

When the electrical conductors are fusible elements, it is of particular concern that damage thereto be avoided. These elements tend to be easily deformed and shifted due to their ductile nature. In the card type connector of the Invention, it is the protective cover which receives a mechanical shock and not the electrical conductors; thus, the connector of the present Invention is less susceptible to the peeling off of the electrical conductors.

As a modification of the foregoing, the ends of the electrical conductors may be protected by simply applying a coating material thereto; in particular, when the electrical conductors are installed up to the foot portion of the board, merely dipping the ends, including a part of the electrical conductors, in a coating material solution which will easily form an adequate protective layer.

BRIEF DESCRIPTION OF THE DRAWINGS

In the accompanying drawings, in which like reference characters indicate like parts.

DETAILED DESCRIPTION OF THE INVENTION

Figure 1:
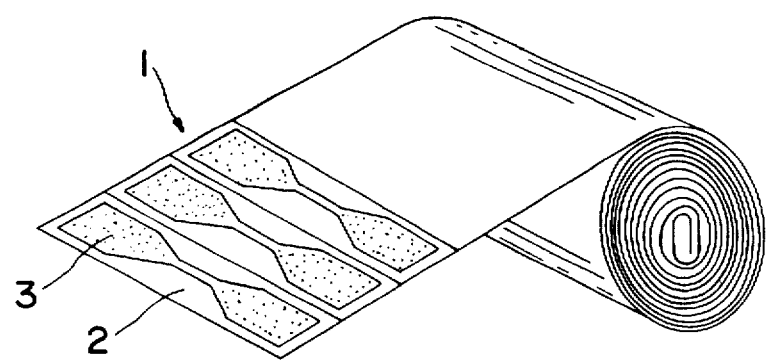
FIG. 1 shows a step in the manufacture of a plate-shaped fuse of the prior art.
Figure 2:
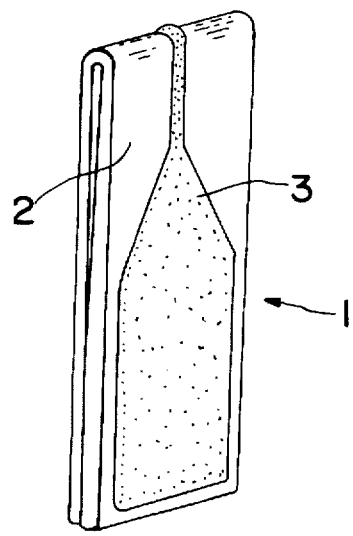
FIG. 2 shows the product of FIG. 1 in its final form.
Figure 3:
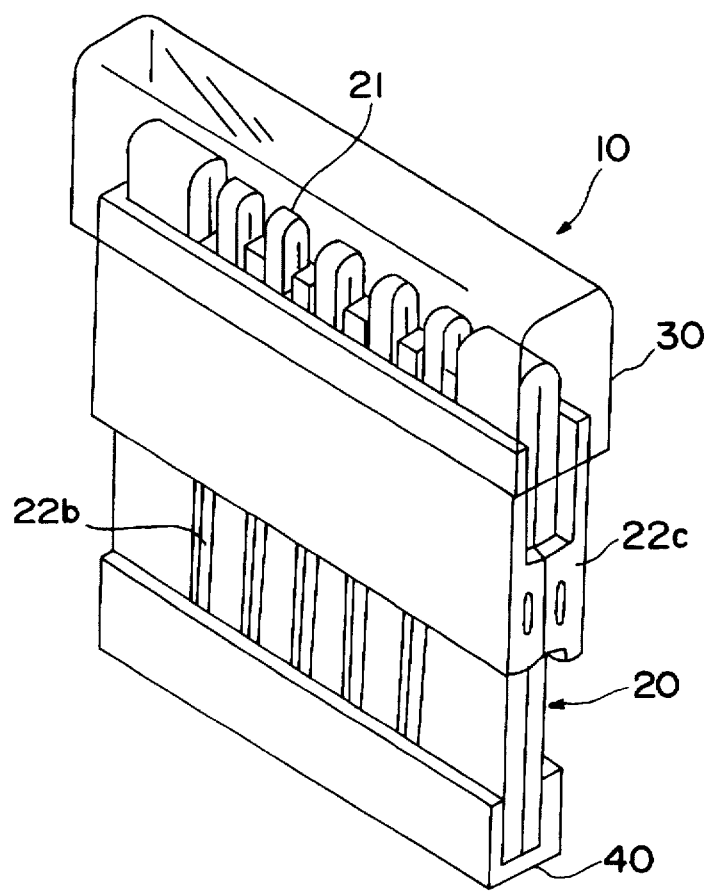
FIG. 3 is a perspective view of the card-type connector of the present Invention.

Referring to FIG. 3, fuse 10 comprises board 20 and fusible elements 21. The latter serve as electrical conductors and extend onto both faces of board 20. Transparent cap 30 covers the head portion of board 20 so that an observer can determine whether any of fusible elements 21 have melted due to current overload. Additionally, protective cover 40 is on the foot portion, remote from cap 30. This cover prevents damage to the ends of elements 21 when fuse 10 is inserted into its complementary socket.

Figure 4:
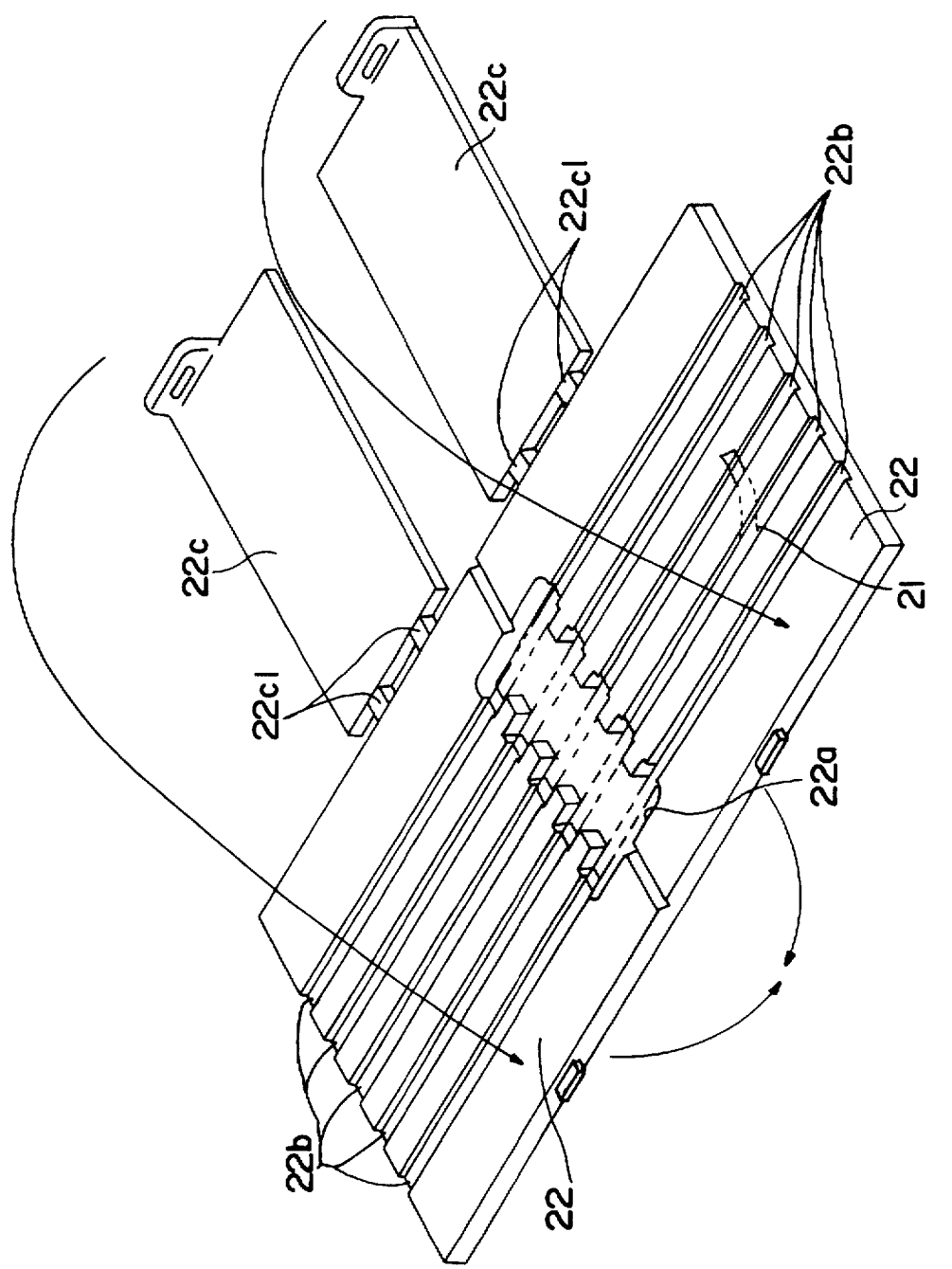
FIG. 4 shows the insulation plates with grooves and the protective plates before being formed into the connector of the Invention.

The form of the Invention wherein the fusible elements are protected by hinged plates is best shown in FIG. 4. Insulation plate 22 carries grooves 22b and has opening 22a straddling the center fold thereof. Protective plates 22c are connected to insulation plate 22 by hinges 22c1.

Figure 6:
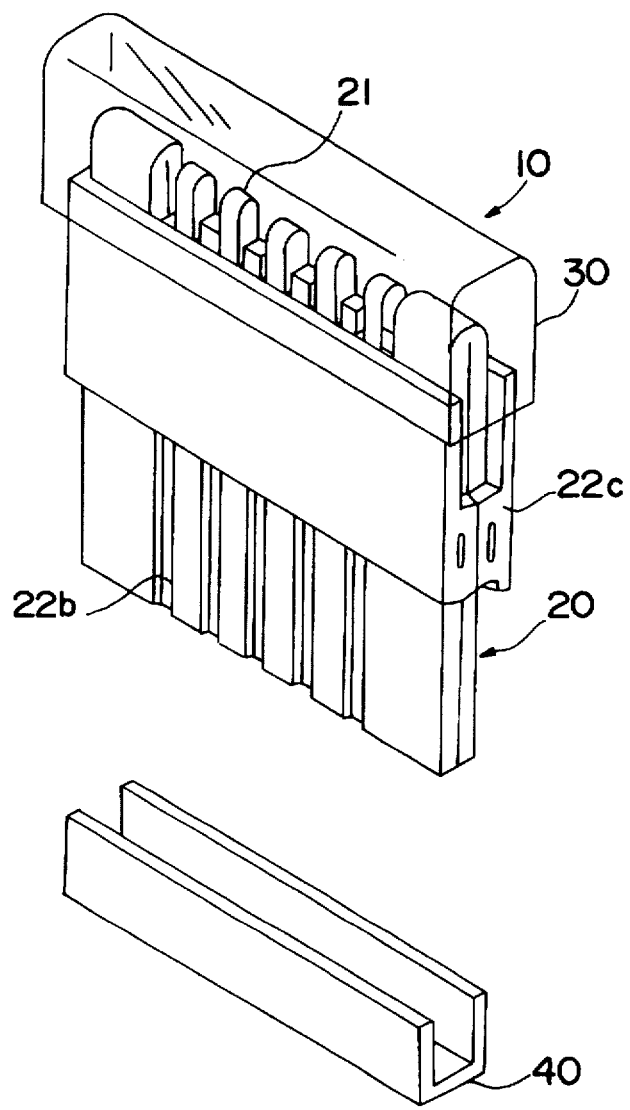
FIG. 6 shows the connector of FIG. 5 before the protective cover has been fitted.

In assembly, conductors 21 are placed in grooves 22b and adhered thereto, as by the use of a suitable adhesive. Thereafter, protective plates 22c are pivoted around hinges 22c1 so that they overlie insulation plate 22. In this form of the Invention, it is preferred that the ends of conductors 21 are on the intermediate portion of plate 22 between opening 22a and the outer ends of grooves 22b. Advantageously, protective plates 22c carry latches which engage complementary retainers on the opposite longitudinal edge of insulation plate 22. Plate 22 is then folded on the center line so that the two halves abut against each other in back-to-back relationship. Grooves 22b and conductors 21 are exposed. As shown in FIG. 6, cover 40 is placed over the foot portion of fuse 10. This serves to protect the foot portion and the ends of conductors 21 from abrasion upon insertion into the socket.

Figure 5:
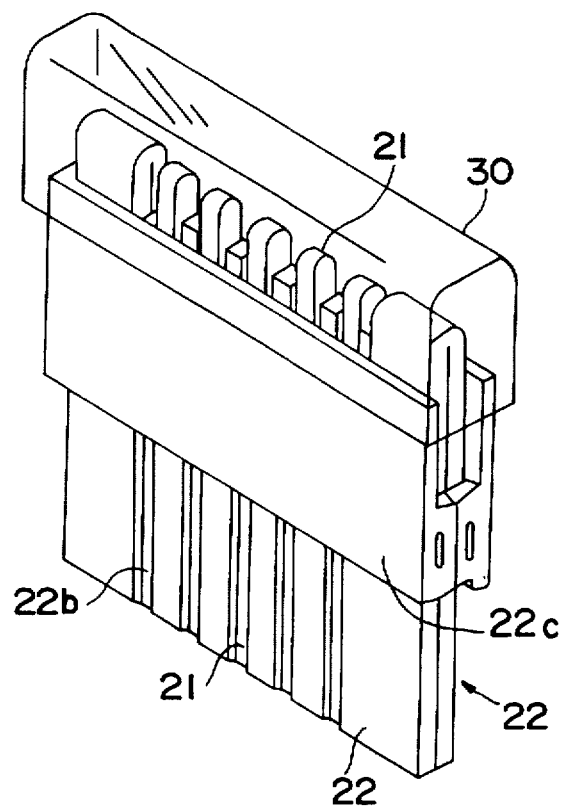
FIG. 5 is a view, similar to that of FIG. 3, showing the inventive connector equipped with protective plates and a cap.

To protect conductors 21 at opening 22a, cap 30 (as shown in FIG. 5) is placed on the head portion of fuse 10. Preferably, cap 30 is transparent so that, if any of conductors 21 have fused, this can readily be noted. If transparent cap 30 is long enough to cover at least a portion of protective plates 22c, it will aid in preventing them from accidentally opening and may even render the latching device unnecessary.

Figure 7:
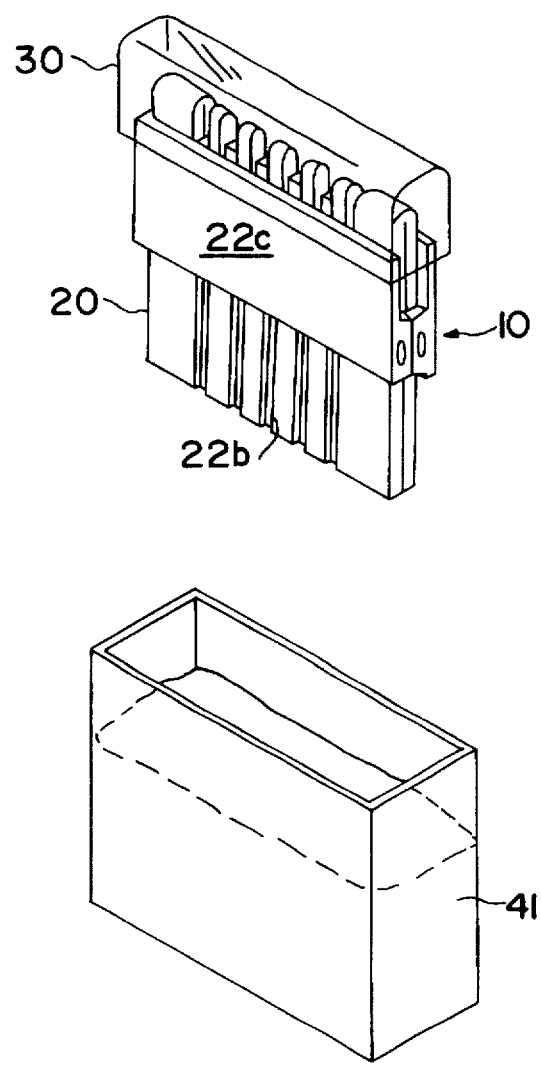
FIG. 7 shows the modification of the Invention wherein the protective cover is a coating.
Figure 8:
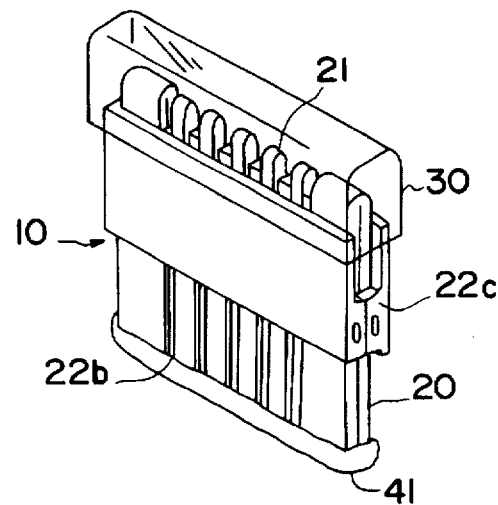
FIG. 8 is the card-type connector of FIG. 7 after the coating has been applied.

As an alternative to cover 40, coating agent 41 (see FIG. 7) is provided in a container therefor. Fuse 10 is dipped into coating agent 41 so that the foot portion, including the ends of conductors 21, is immersed therein. Upon withdrawal and drying, as shown in FIG. 8, the foot portion and conductor ends of the completed fuse are protected thereby.

Figure 9:
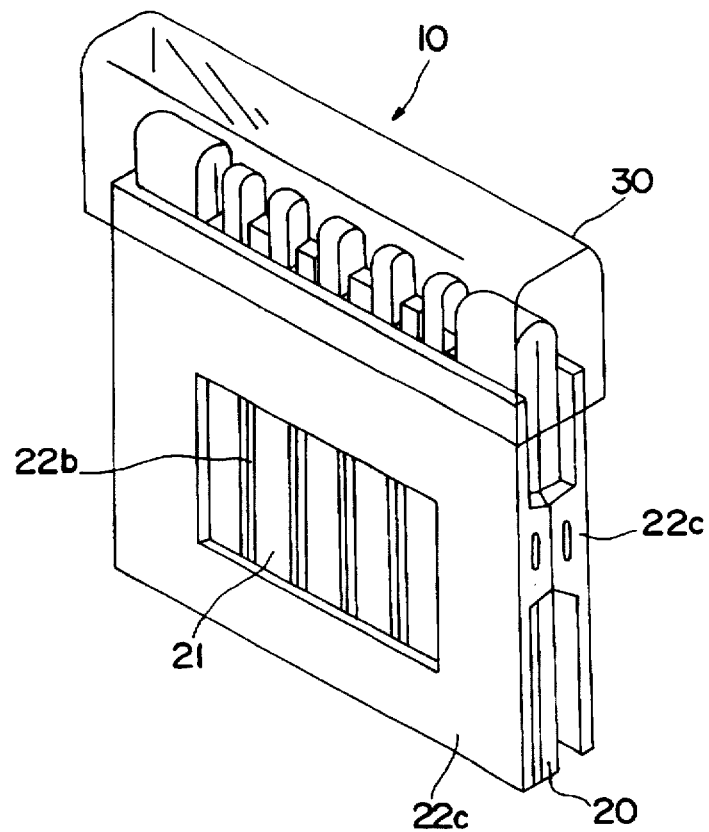
FIG. 9 shows a further modification of the Invention wherein the protective plates are provided with an opening through which the electrical connection is effected.

Referring to FIG. 9, another form of the connector is shown. In this case, protective plates 22c have a window cutout therein, thus exposing conductors 21. As a result, the foot portion is protected and electrical contact can be made through the window. Cover 40 may be rendered unnecessary in this construction.

Figure 10:
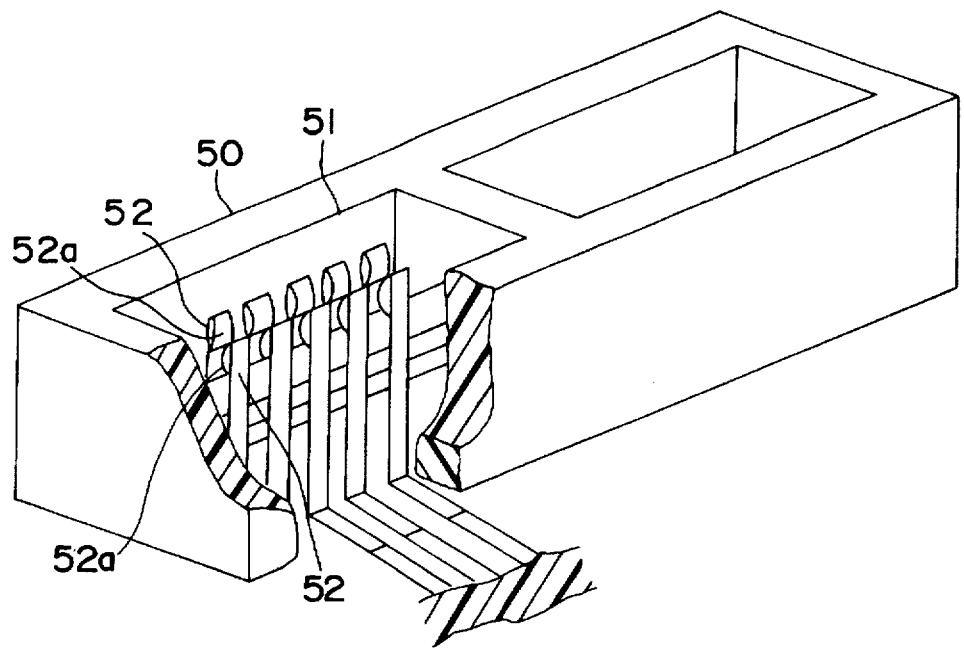
FIG. 10 is a perspective view, partially broken away and in section, of a socket with which the connector of the Invention cooperates.
Figure 11:
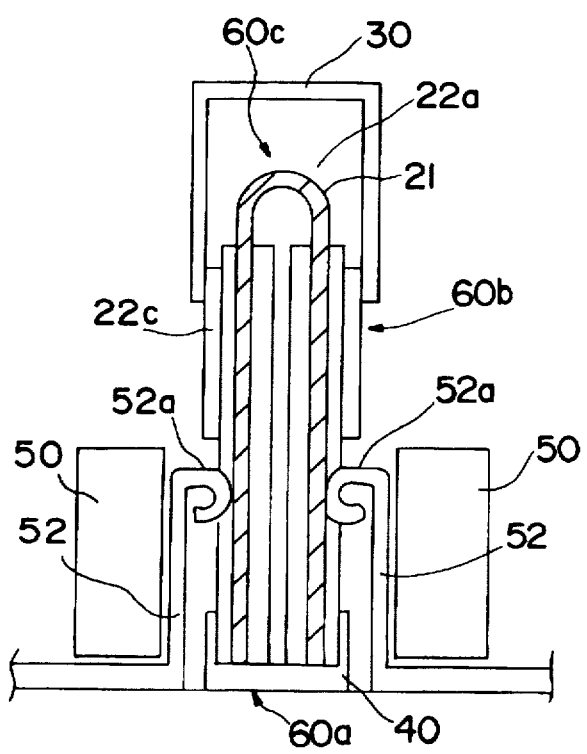
FIG. 11 is an elevational lateral schematic view of the connector of the Invention fitted into the socket.

In FIG. 10, fuse 10 is inserted into insertion aperture 51 of socket 50 so as to make contact with lugs 52a on terminals 52. In FIG. 11, the fuse is shown inserted into socket 50. Head portion 60c is covered by cap 30 and cover 40 encloses foot portion 60a. Between head portion 60c and foot portion 60a is intermediate body section 60b. Protective plates 22c overlie this section. Lugs 52a on terminals 52 are in contact with conductors 21. After board 20 has been constructed, foot portion 60a is protected by application of cover 40 which is a channel having a substantially U-shaped cross-section, as shown in FIG. 6.

Although only a limited number of specific embodiments of the present Invention have been expressly described, there are many modifications thereof which would readily suggest themselves to the person of ordinary skill. For example, the fuse may be of any shape which contains at least one electrical conductor and is inserted into a socket containing metallic terminals, provided that it is inserted into the socket in such a way that the terminals ride up over the leading edge of the fuse. Thus, it can resemble a printed circuit board, plate-like unit, etc. It may also be mounted on apparatus and project therefrom for engagement with a socket.

It is contemplated that a plurality of conductors in a corresponding plurality of grooves be part of the fuse or connector. It has been found desirable to have an adhesive layer between the surface of the grooves and the underside of the conductors located therein. This assists in retaining the conductors in the grooves and aids in preventing peeling off.

In the form of the Invention in which the protective cover is on the foot portion of the connector, it may be attached in any known manner. However, the use of adhesive is preferred. The adhesive agent is advantageously contained within the cover, to facilitate drying during manufacture. However, the use of the additional cover raises the unit costs and also increases the size of the completed connector. On the other hand, if the coating agent is applied, the cost is low and a thin film is easily obtained. However, the drying of the coating layer is more difficult.

These and other modifications, apparent to the person of ordinary skill, may be made in the foregoing Invention without departing from the scope or spirit thereof. It is, therefore, to be broadly construed and not to be limited except by the character of the claims appended hereto.

What we claim is:

1. An electrical connector adapted for introduction into an insertion position in a complementary socket containing at least one terminal biased toward said connector when in said insertion position, said connector having a foot portion, constituting a leading edge when said connector is inserted into said socket, a heat portion remote from said foot portion, and a body portion therebetween, said connector comprising a first insulation board and a second insulation board placed back-to-back, said first board having a first outer face, said second board having a second outer face, at least one first groove in said first face and, in alignment therewith, at least one second groove in said second face, a conductor, having two ends, and a central portion therebetween in said first groove and said second groove, one of said ends being in said first groove and another of said ends being in said second groove, said conductor being bent at said central portion between said first groove and said second groove at said head portion, said ends being in said body portion or adjacent said foot portion, a protective cover on said foot portion or said body portion overlying said ends of said conductors, said first insulation board and said second insulation board being joined at a central fold line, said protective cover comprising a first protective plate on said first face and a second protective plate on said second face, said first plate and said second plate overlying said ends, said first protective plate being hinged to said first board and said second protective plate being hinged to said first board or said second board.

2. The connector of claim 1 wherein there is a pair of terminals, one contacting said conductor on said first face and another contacting said conductor on said second face.

3. The connector of claim 1 wherein there is a plurality of said conductors and said terminals.

4. The connector of claim 1 wherein said ends are adjacent said foot portion.

5. The connector of claim 1 wherein there is an element encasing said ends.

6. The connector of claim 5 wherein said element is a channel member having a U-shaped cross section.

7. The connector of claim 1 wherein said element is a coating.

8. The connector of claim 1 wherein said element extends onto said body portion.

9. The connector of claim 1 wherein said first plate and said second plate each have a window therein, whereby said conductor is exposed to said terminal for electrical contact.

10. The connector of claim 1 wherein said conductor is retained in said first groove and said second groove by an adhesive.

11. The connector of claim 1 wherein said conductor is a fusible element and said connector is a fuse.

12. The electrical connector of claim 1 comprising an opening between said first board and said second board, said opening straddling said center fold line and extending over a substantial portion thereof.

13. An electrical connector adapted for introduction into an insertion position in a complementary socket containing at least one terminal biased toward said connector when in said insertion position, said connector having a foot portion, constituting a leading edge when said connector is inserted into said socket, a heat portion remote from said foot portion, and a body portion therebetween, said connector comprising a first insulation board and a second insulation board placed back-to-back, said first board having a first outer face, said second board having a second outer face, at least one first groove in said first face and, in alignment therewith, at least one second groove in said second face, a conductor, having two ends, and a central portion therebetween in said first groove and said second groove, one of said ends being in said first groove and another of said ends being in said second groove, said conductor being bent at said central portion between said first groove and said second groove at said heat portion, said ends being in said body portion or adjacent said foot portion, a protective cover on said foot portion or said body portion overlying said ends of said conductors, a cap enclosing said head portion, said cap overlying a part of said first protective plate and a part of said second protective plate.

14. The connector of claim 13 wherein said cap is transparent.

15. A method for production of an electrical connector from an insulation plate having parallel, spaced apart lateral edges, and parallel, spaced apart longitudinal sides perpendicular to said lateral edges, said insulation plate having a center fold line parallel to said lateral edges, extending between said longitudinal sides, and located about midway between said lateral edges, forming an opening in said insulation plate straddling said center fold line and extending over a substantial portion thereof, forming at least one groove in said insulation plate extending from one of said lateral edges to another of said lateral edges, said groove intersecting said opening, affixing said conductor in said groove so that said ends of said conductor are in said body portion or adjacent said foot portion and said central portion spans said opening, thereafter, folding said insulation plate on said central fold line so that said lateral sides are adjacent each other and said conductor faced outwardly, and applying said protective cover to said foot portion, said insulation plate comprising protective plates hinged to said longitudinal sides on both sides of said center fold line, said method comprising folding each of said protective plates onto said insulation plate whereby one of said protective plates overlies one of said ends and another of said protective plates overlies another of said ends.

16. The method of claim 15 comprising fixing said protective plates to said insulation plates in a secured position overlying said ends.

17. The method of claim 15 comprising affixing a cap on said head portion.

18. The method of claim 15 comprising dipping said foot portion into a coating agent and permitting said agent to dry, thereby forming said protective cover surrounding said ends.

19. A method for the production of an electrical connector adapted for introduction into an insertion position in a complementary socket containing at least one terminal biased toward said connector when in said insertion position, said connector having a foot portion, constituting a leading edge when said connector is inserted into said socket, a heat portion remote from said foot portion, and a body portion therebetween, said connector comprising a first insulation board and a second insulation board placed back-to-back, said first board having a first outer face, said second board having a second outer face, at least one first groove in said first face and, in alignment therewith, at least one second groove in said second face,

- a conductor, having two ends, and a central portion therebetween in said first groove and said second groove, one of said ends being in said first groove and another of said ends being in said second groove, said conductor being bent at said central portion between said first groove and said second groove at said heat portion, said ends being in said body portion or adjacent said foot portion, a protective cover on said foot portion or said body portion overlying said ends of said conductors,
- said electrical connector being produced from an insulation plate having parallel spaced apart lateral edges, and parallel, spaced apart longitudinal sides perpendicular to said lateral edges, said insulation plate having a center fold line parallel to said lateral edges, extending between said longitudinal sides, and located about midway between said lateral edges, said method comprising forming an opening in said insulation plate straddling said center fold line and extending over a substantial portion thereof, forming at least one groove in said insulation plate extending from one of said lateral edges to another of said lateral edges, said groove intersecting said opening, affixing said conductor in said groove so that said ends of said conductor are in said body portion or adjacent said foot portion and said central portion spans said opening, thereafter, folding said insulation plate on said central fold line so that said lateral sides are adjacent each other and said conductor faced outwardly, and applying said protective cover to said foot portion, said insulation plate comprising protective plates hinged to said longitudinal sides on both sides of said center fold line, said method comprising folding each of said protective plates onto said insulation plate whereby one of said protective plates overlies one of said ends and another of said protective plates overlies another of said ends.

* * * * *